United States Patent
McClain, Jr. et al.

(10) Patent No.: US 8,665,035 B2
(45) Date of Patent: Mar. 4, 2014

(54) SYSTEMS AND METHODS FOR GENERATING PULSED OUTPUT SIGNALS USING A GATED RF OSCILLATOR CIRCUIT

(75) Inventors: Ross A. McClain, Jr., Greenville, TX (US); Brian C. Rutherford, Royse City, TX (US)

(73) Assignee: L-3 Communications Integrated Systems LP, Greenville, TX (US)

( * ) Notice: Subject to any disclaimer, the term of this patent is extended or adjusted under 35 U.S.C. 154(b) by 609 days.

(21) Appl. No.: 12/387,490

(22) Filed: May 1, 2009

(65) Prior Publication Data

US 2010/0277248 A1 Nov. 4, 2010

(51) Int. Cl.
- *H03C 1/62* (2006.01)
- *H03C 1/02* (2006.01)
- *H03B 5/20* (2006.01)

(52) U.S. Cl.
USPC .... 332/149; 332/116; 331/108 R; 331/108 B; 331/173

(58) Field of Classification Search
USPC ............... 331/165, 172–174, 55, 153, 108 R, 331/108 B, 138, 140; 332/149, 115, 116; 375/268, 300, 309
See application file for complete search history.

(56) References Cited

U.S. PATENT DOCUMENTS

| | | | |
|---|---|---|---|
| 3,682,160 A * | 8/1972 | Murata | 600/302 |
| 3,991,388 A * | 11/1976 | Harshbarger | 331/117 R |
| 4,641,317 A | 2/1987 | Fullerton | |
| 4,813,057 A | 3/1989 | Fullerton | |
| 4,979,186 A | 12/1990 | Fullerton | |
| 5,363,108 A | 11/1994 | Fullerton | |
| 5,677,927 A | 10/1997 | Fullerton et al. | |
| 5,687,169 A | 11/1997 | Fullerton | |
| 5,832,035 A | 11/1998 | Fullerton | |
| 5,901,172 A | 5/1999 | Fontana et al. | |
| 6,026,125 A | 2/2000 | Larrick, Jr. et al. | |
| 6,054,950 A | 4/2000 | Fontana | |
| 6,300,903 B1 | 10/2001 | Richards et al. | |
| 6,466,125 B1 | 10/2002 | Richards et al. | |
| 6,466,168 B1 | 10/2002 | McEwan | |
| 6,469,628 B1 | 10/2002 | Richards et al. | |
| 6,483,461 B1 | 11/2002 | Matheney et al. | |
| 6,489,893 B1 | 12/2002 | Richards et al. | |
| 6,501,393 B1 | 12/2002 | Richards et al. | |
| 6,512,455 B2 | 1/2003 | Finn et al. | |
| 6,586,999 B2 | 7/2003 | Richley | |
| 6,661,342 B2 | 12/2003 | Hall et al. | |

(Continued)

FOREIGN PATENT DOCUMENTS

WO    WO 2007023866 A1 *    3/2007

OTHER PUBLICATIONS

Rogers Corporation, "RO4000 Series High Frequency Circuit Materials", Advanced Circuit Materials, Data Sheet, 2007, 8 pgs.

Rogers Corporation, "Introducing RO4003C and RO4350B Laminates With TICER TCR Thin Film Resistor Foils", Advanced Circuit Materials, Data Sheet 2008, 1 pg.

Her et al., "A Fully Integrated 3.1-10.6 GHz Ultra Wideband Low Noise Amplifier With Inter-Stage Inductor", Department of Communication Engineering, Feng Chia University, Printed from Internet Jan. 1, 2009, 4 pgs.

(Continued)

*Primary Examiner* — Ryan Johnson
(74) *Attorney, Agent, or Firm* — Egan, Peterman, Enders LLP.

(57) ABSTRACT

Systems and methods for generating pulsed output signals that employ a gated RF oscillator circuit having an output that is switchably grounded through the emitter of a transistor and including feedback from the output of the circuit to the base of the transistor to create oscillations and to allow a digital input pulse of a desired length to control the start and stop of oscillations created by the transistor.

27 Claims, 6 Drawing Sheets

(56) References Cited

U.S. PATENT DOCUMENTS

| | | |
|---|---|---|
| 6,690,741 B1 | 2/2004 | Larrick, Jr. et al. |
| 6,750,757 B1 | 6/2004 | Gabig, Jr. et al. |
| 6,812,884 B2 | 11/2004 | Richley et al. |
| 6,900,732 B2 | 5/2005 | Richards |
| 6,989,751 B2 | 1/2006 | Richards |
| 7,170,408 B2 | 1/2007 | Taylor et al. |
| 7,209,523 B1 | 4/2007 | Larrick et al. |
| RE39,759 E | 8/2007 | Fullerton |
| 7,369,598 B2 | 5/2008 | Fontana et al. |
| 7,397,379 B2 | 7/2008 | Richards et al. |
| 7,405,658 B2 | 7/2008 | Richards |
| 7,412,007 B1 | 8/2008 | Richley et al. |
| 7,466,205 B1 | 12/2008 | Lin et al. |
| 7,474,219 B2 | 1/2009 | Richards et al. |
| 7,888,984 B2 * | 2/2011 | Kobayashi et al. .......... 327/291 |
| 2008/0291973 A1 | 11/2008 | Azakkour et al. |

OTHER PUBLICATIONS

Bipolar Junction Transistors, "Feedback", All About Circuits, Printed from Internet Jan. 1, 2009, 10 pgs.

Fontana, "Recent System Applications of Short-Pulse Ultra-Wideband (UWB) Technology", IEEE Transactions on Microwave Theory and Techniques, vol. 52, No. 9, Sep. 2004, 18 pgs.

Green et al., "System Architectures for High-Rate Ultra-Wideband Communication Systems: A Review of Recent Developments", Intel White Paper 241, 2004, 11 pgs.

Wentzloff et al., "System Design Considerations for Ultra-Wideband Communication", Topics in Circuits for Communications, IEEE Communications Magazine, Aug. 2005, 8 pgs.

Wentzloff et al. "System Design Considerations for Ultra-Wideband Communication, Topics in Circuits for Communications", IEEE Communications Magazine, Aug. 2005, 8 pgs.

* cited by examiner

SYSTEMS AND METHODS FOR GENERATING PULSED OUTPUT SIGNALS USING A GATED RF OSCILLATOR CIRCUIT

FIELD OF THE INVENTION

This invention relates generally to signal generation, and more particularly to a gated RF oscillator circuit and use of same for pulsed signal generation.

BACKGROUND OF THE INVENTION

As defined by the FCC, an ultra-wideband (UWB) signal is an antenna transmission in the range of 3.1 GHz up to 10.6 GHz at a limited transmit power of −41.3 dBm/MHz with an emitted signal bandwidth that exceeds the lesser of 500 MHz or 20% of the center frequency. UWB signals are currently employed for high-bandwidth, short range communications that use high bandwidth radio energy that is pulsed at specific time instants.

Applications for FCC-defined transmissions include distance-based location and tracking applications, and localization techniques that employ precision time-of-arrival measurements. Examples of such UWB applications include RFID tags that employ UWB communication technology for tracking, localization and transmitting information. Other types of UWB applications include precision radar imaging technology.

Pulsed super high frequency (SHF) signals of from about 3 to about 30 GHz may be generated by switching a continuous wave signal on and off to generate a short SHF pulse of energy for transmission by an antenna. Such a continuous wave signal may be generated by a continuous wave oscillator. A switch may be coupled between the continuous wave oscillator and the output of the circuit to produce the pulsed SHF signals by cycling the switch on and off.

SUMMARY OF THE INVENTION

Disclosed herein are systems and methods for generating pulsed output signals that employ a gated RF oscillator circuit having an output that is switchably grounded through the emitter of a transistor. The gated RF oscillator circuit employs feedback from the output of the circuit to the base of the transistor to allow a digital input pulse of a desired length to control the start and stop of oscillations from the circuit that generate RF oscillations for the pulsed output signal. A digital input pulse is fed to the base of the transistor to turn the transistor on and ground the circuit output (i.e., so that the transistor then operates in saturation mode), which in turn causes a drop in the output voltage from the output of the circuit. While the digital input pulse is still present at the base of the transistor, the drop in output voltage is fed back to the base of the transistor to turn the transistor off, causing the output voltage of the gated RF circuit to again go high. When the voltage at the base of the transistor goes high, it turns on the transistor and grounds the output of the circuit once more, resulting in another drop in voltage at the base of the transistor, thus turning the transistor off again. This sequence of turning the transistor on and off results in RF oscillations in the output signal pulse. The oscillations continue during the duration of time that the digital input signal pulse is fed to the base of the transistor. Advantageously, the transistor may be provided in one embodiment to be capable of turning on in less than a nanosecond, and turning off in less than a nanosecond, making high frequency oscillations possible.

In one embodiment of the disclosed systems and methods, a relatively high frequency pulse of energy (e.g., SHF pulse of from about 3 to about 30 GHz) may be transmitted at low power and low cost relative to conventional circuitry and methodology by employing a gated RF oscillator circuit that does not require the consumption of power when output signal pulses are not being transmitted, unlike a conventional continuous wave oscillator that consumes power all the time, i.e., during pulses and between pulses. Since power may be advantageously turned off during the time in-between output pulse sequences, power savings may be achieved as compared to conventional continuous wave oscillator circuit devices which require more power. Such reduced power consumption offers advantages for use in portable devices having limited battery capacity, such as for use in wireless RFID tags. Additionally, in one exemplary embodiment the disclosed gate RF oscillator circuit may be employed without requiring the use of a switch which would be required for conventional continuous wave oscillators that must be turned on and off to generate each pulse, i.e., albeit at slower speeds than possible with the disclosed systems and methods. In this regard, the transistor of one embodiment of the disclosed gate RF oscillator circuit is capable of turning off in less than a nanosecond (and turning on in less than a nanosecond) without requiring an additional switch which would not be capable of such fast on and off speeds.

In one embodiment, the disclosed systems and methods may be employed for the generation of pulse sequences for FCC-defined UWB signal applications (i.e., an emitted signal in the range of 3.1 GHz up to 10.6 GHz at a limited transmit power of −41.3 dBm/MHz with an emitted signal bandwidth that exceeds the lesser of 500 MHz or 20% of the center frequency) and, in one example, may be employed to generate pulse sequences that are transmitted once every about 1 second to about 60 seconds, and that include output signal pulses within each sequence that are from about 1 nanoseconds to about 3 nanoseconds long and transmitted about once every 2 microseconds. However, other pulse sequence frequencies may be generated, and/or other duration and frequency of output signal pulses may be created using the disclosed systems and methods.

In one respect, disclosed herein is oscillator circuitry, including: a transistor switching element having a control terminal, input terminal and output terminal, the input terminal of the transistor switching element being coupled to a power source and an output of the oscillator circuitry, the control terminal of the transistor switching element being coupled to an input voltage pulse source, and the output terminal of the transistor being coupled to ground; and a feedback path coupled between the input terminal and control terminal of the transistor switching element. The transistor switching element remains in the off condition during the absence of an input voltage pulse applied to the control terminal of the transistor switching element. The transistor switching element cycles between on and off in response to an input voltage pulse applied to the control terminal of the transistor switching element while voltage is supplied from the power source to the input terminal of the transistor element to generate voltage oscillations at the output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition.

In another respect, disclosed herein is a RF signal generation system, including: input pulse creation circuitry configured to produce an input voltage pulse; and oscillator circuitry having a signal input coupled to receive the input voltage pulse from the input pulse creation circuitry, having a signal output to produce an RF output signal, and having a power input coupled to receive power from a power source. The oscillator circuitry may include: a transistor switching element having a control terminal, input terminal and output terminal, the input terminal of the transistor switching element being coupled to the power input of the oscillator circuitry and the signal output of the oscillator circuitry, the control terminal of the transistor switching element being coupled to the signal output of the oscillator circuitry, and the output terminal of the transistor being coupled to ground, and a feedback path coupled between the input terminal and control terminal of the transistor switching element. The transistor switching element remains in the off condition during the absence of an input voltage pulse applied to the control terminal of the transistor switching element, and the transistor switching element cycles between on and off in response to an input voltage pulse applied to the control terminal of the transistor switching element while voltage is supplied from the power source to the input terminal of the transistor element to generate voltage oscillations at the output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition.

In another respect, disclosed herein is a method for generating an oscillating signal, including: providing oscillator circuitry including a transistor switching element having a control terminal, input terminal and output terminal, the input terminal of the transistor switching element being coupled to a power source and an output of the oscillator circuitry, the control terminal of the transistor switching element being coupled to an input voltage pulse source, and the output terminal of the transistor being coupled to ground, and a feedback path coupled between the input terminal and control terminal of the transistor switching element; maintaining the transistor switching element in an off condition during the absence of an input voltage pulse applied to the control terminal of the transistor switching element; and simultaneously supplying voltage to the input terminal of the transistor element and applying an input voltage pulse to the control terminal of the transistor switching element to cause the transistor switching element to cycle between on and off so as to generate voltage oscillations at the output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition.

DESCRIPTION OF ILLUSTRATIVE EMBODIMENTS

Figure 1A:
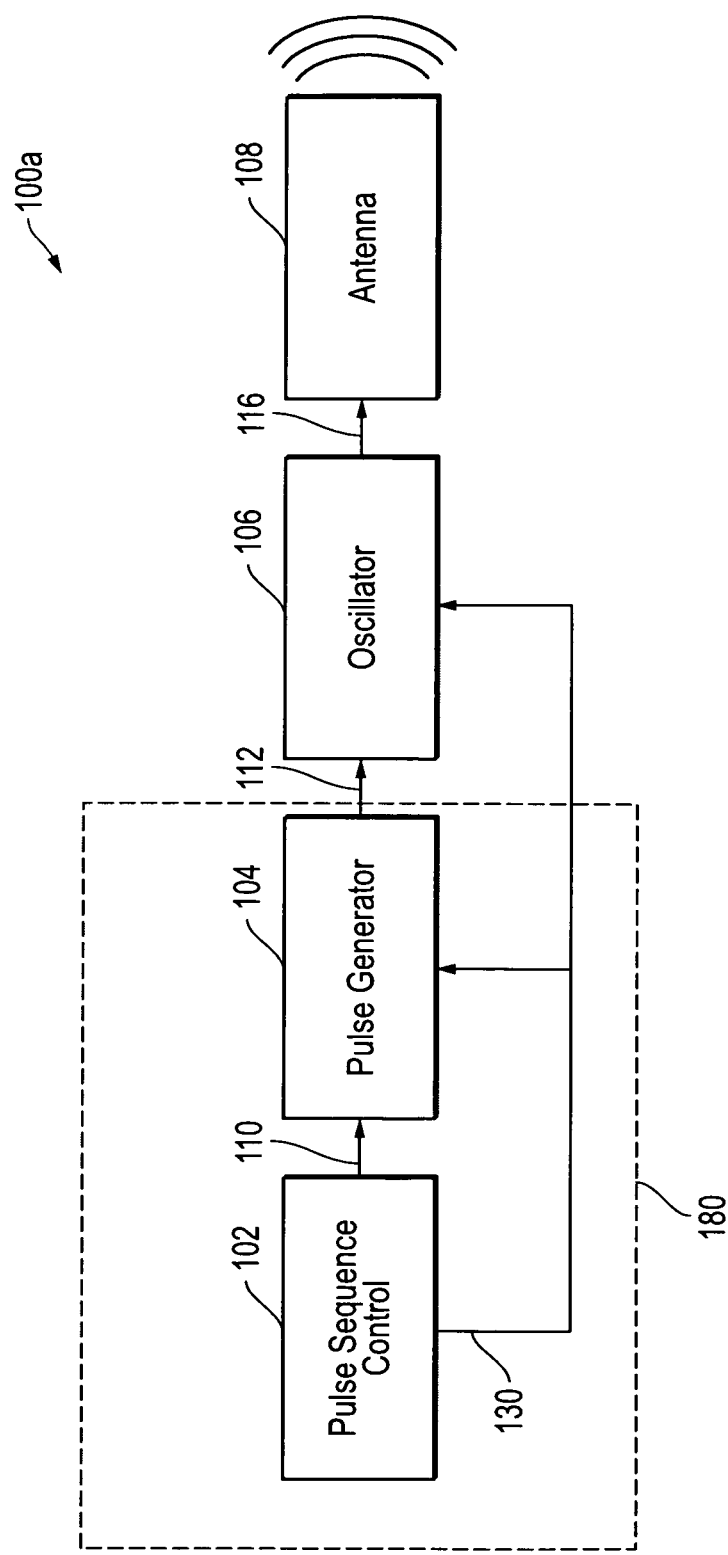
FIG. 1A is a block diagram of RF signal generation system according to one exemplary embodiment of the disclosed systems and methods.

FIG. 1A illustrates one exemplary embodiment of a RF signal generation system 100 that includes input pulse creation circuitry 180 which is configured to produce and supply a digital oscillator input voltage pulse 112 to a signal input of oscillator circuitry 106, which in turn produces an RF output signal 116 for transmission by antenna 108, e.g., as RF signals in the voltage output to antenna 108 that meet the characteristics defined by the FCC for UWB signals. RF signal generation system 100 may be employed as transmitter circuitry of, for example, a battery-powered portable radio frequency identification (RFID) tag. In this exemplary embodiment, input pulse creation circuitry 180 includes pulse sequence control circuitry 102 and pulse generator circuitry 104 which will be described in further detail herein. However, it will be understood that any other circuitry configuration suitable for producing a digital oscillator input voltage pulse 112 having the characteristics described herein may be employed. Further, it will be understood that RF signal generation system 100 is just one exemplary embodiment of an application in which the disclosed gated RF oscillator circuit may be suitably employed.

In the exemplary embodiment of FIG. 1A, pulse sequence control circuitry 102 is coupled to supply intermittent pulse sequence signals 110 to pulse generator circuitry 104, the duration of each corresponding to an individual pulse sequence. Pulse sequence control circuitry 102 is also coupled to provide an intermittent power control signal 130 to each of pulse generator circuitry 104 and to a power input of oscillator circuitry 106 simultaneously with the supply of each intermittent pulse sequence signal 110 to pulse generator circuitry 104, i.e., such that power control signal 130 is only provided during each pulse sequence. Pulse generator circuitry 104 is in turn coupled to receive each pulse sequence signal 110 and to generate a digital oscillator input voltage pulse 112 in response to pulse sequence signal 110, which is then provided to a signal input of oscillator circuitry 106 as shown. Oscillator circuitry 106 is coupled to receive oscillator input voltage pulse 112 and in response provide a relatively high frequency RF output signal 116 (e.g., as an ultra-wideband RF signal) from a signal output to antenna 108 during the duration of each oscillator input voltage pulse 112 provided by pulse generator circuitry 104. In this manner, pulse sequence control circuitry 102 controls the duration of each pulse sequence in which an RF output signal 116 is transmitted by antenna 108.

In the exemplary embodiment of FIG. 1A, pulse sequence control circuitry 102 may be a microcontroller or any other circuitry suitable for controlling pulse sequences by simultaneously generating an intermittent pulse sequence signal 110 and corresponding power control signal 130 (e.g., of about 3 volts DC) for each pulse sequence that has characteristics as described elsewhere herein. Specific examples of suitable pulse sequence control circuitry 102 include, but are not limited to, microcontrollers, state machines, etc. In the practice of the disclosed systems and methods, the length or duration of each pulse sequence may be varied as needed or desired to fit the requirements of a particular application and in one exemplary embodiment may be, for example, from about 100 nanoseconds to about one microsecond in length, although pulse sequence lengths of less than about 100 nanoseconds and greater than about one microseconds are also possible. Further, pulse sequences may be transmitted at any frequency suitable to meet the characteristics of a given application, e.g., from about once every second to about once every 60 seconds, although pulse sequence frequencies of greater than once every second (e.g., twice per second, eight times per second, etc.) and less than once every 60 seconds are also possible.

With regard to the exemplary embodiment of FIG. 1A, power control signal 130 may be provided, for example, to switch circuitry in each of pulse generator circuitry 104 and oscillator circuitry 106 such that power (e.g., 3 volts DC) is supplied to (and consumed by) the circuitry components within pulse generator circuitry 104 and oscillator circuitry 106 only during each pulse sequence, and such that no power is supplied to (and consumed by) the circuitry components within pulse generator circuitry 104 and oscillator circuitry 106 between pulse sequences. However, it will be understood that any other power circuit configuration may be employed that is suitable for only supplying power to pulse generator circuitry 104 and oscillator circuitry 106 during pulse sequences, e.g., including by supplying power control signal 130 to a separate power supply circuit that is controlled to intermittently supply power to pulse generator circuitry 104 and oscillator circuitry 106 only during pulse sequences.

Figure 1B:
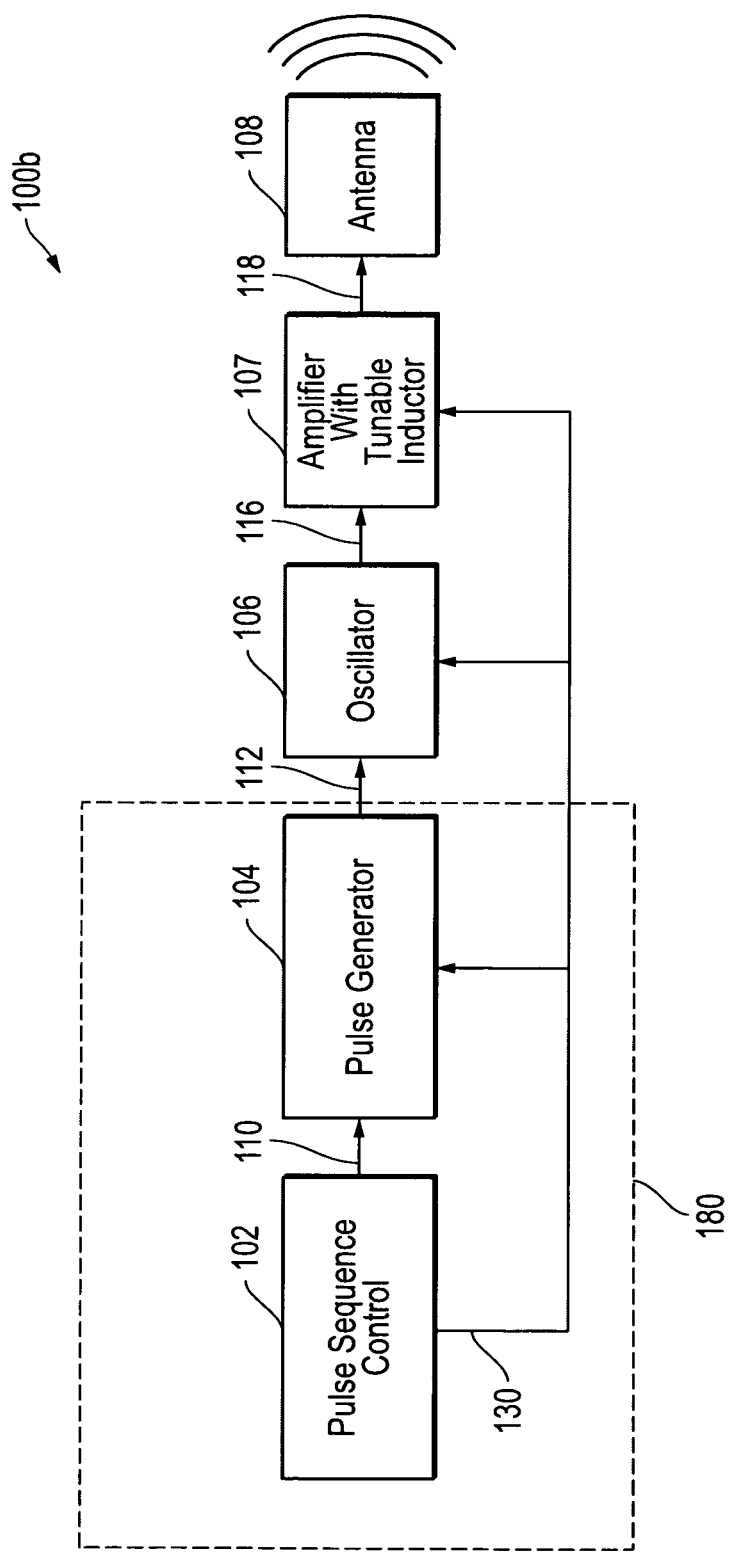
FIG. 1B is a block diagram of RF signal generation system according to one exemplary embodiment of the disclosed systems and methods.

It will be understood that FIG. 1A represents just one exemplary configuration of a RF signal generation system 100 that may be implemented using the disclosed systems and methods. For example, FIG. 1B illustrates another exemplary embodiment of a RF signal generation system 100 that includes optional amplifier circuitry 107 coupled between oscillator circuitry 106 and antenna 108. In this exemplary embodiment, amplifier circuitry 107 may be provided with tunable inductor to vary the frequency of RF output signal 116 to produce an altered RF output signal 118 for transmission by antenna 108. Specific examples of components that may be employed to implement amplifier circuitry 107 with tunable inductor include but are not limited to, MMIC amplifiers, class E amplifiers, class F amplifiers, and using PCB traces or other suitable circuit configuration. As shown in FIG. 1B, optional amplifier circuitry 107 may also be provided with a power control signal 130 from pulse sequence control circuitry 102.

Figure 2:
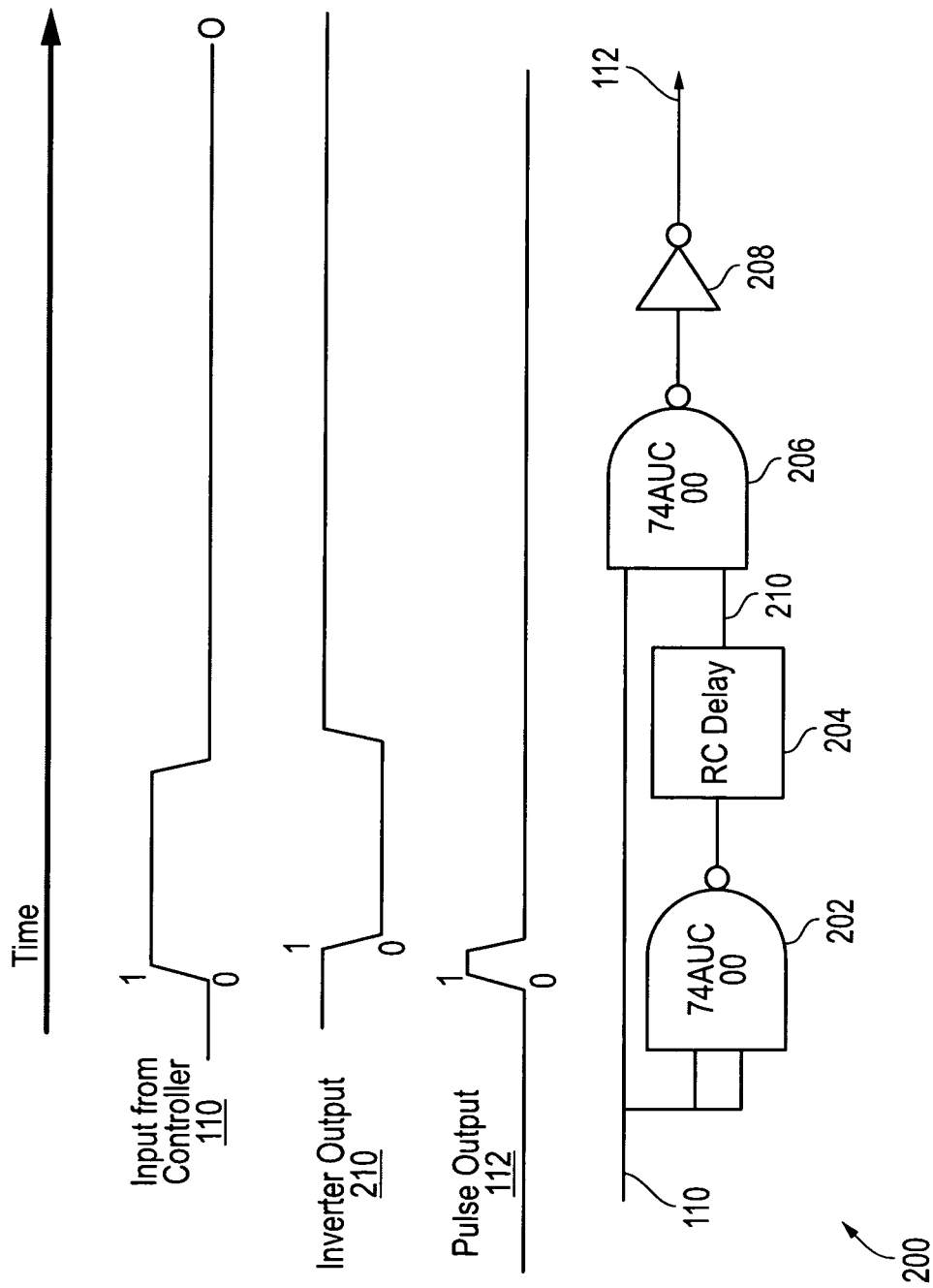
FIG. 2 illustrates pulse generator circuitry logic according to one exemplary embodiment of the disclosed systems and methods.

FIG. 2 illustrates one exemplary embodiment of pulse generator circuitry logic 200 with which pulse generator circuitry 104 may be implemented in the practice of the disclosed systems and methods. As shown, for each pulse sequence, intermittent pulse sequence signal 110 is provided from pulse sequence control circuitry 102 to pulse generator 104 as an intermittent binary high value that is supplied to both inputs of NAND logic gate 202 and a first input of NAND logic gate 206. The output of NAND gate 202 is then fed to delay 204 (e.g., RF delay line circuitry, fixed RC time constant circuitry) to produce a delayed inverted signal 210 for the second input of NAND gate 206. The output of NAND gate 206 is then fed to NOT gate 208 to produce oscillator input voltage pulse 112 that is provided to oscillator circuitry 106. It will be understood that pulse generator circuitry 104 may be implemented using the aforedescribed combination and other combinations of AND, NAND, OR, NOR, INVERTER gates, etc.

FIG. 2 further illustrates binary value versus time for each of intermittent pulse sequence signal 110, delayed inverted signal 210, and oscillator input voltage pulse 112 of pulse generator circuitry 106. In this example, intermittent pulse sequence signal 110 (e.g., of from about 100 nanoseconds to about one microsecond in duration) is provided during each pulse sequence as a binary high value by pulse sequence control circuitry 102, and is then inverted and delayed to produce delayed inverted signal 210 of the same duration as intermittent pulse sequence signal 110. This results in a shortened oscillator input voltage pulse 112 that is produced after passage through NAND gate 206 and NOT gate 208. Pulse generator circuitry 106 may be so configured to produce an oscillator input voltage pulse 112 of a length as needed or desired to fit the requirements of a particular application. In one exemplary embodiment, oscillator input voltage pulse 112 may be produced having a length from about 1 to about 3 nanoseconds in duration (alternatively about 2 nanoseconds), although oscillator input pulse lengths of less than about 1 nanoseconds and greater than about 3 microseconds are also possible. Length of each oscillator input voltage pulse 112 may be controlled by the amount of delay imparted by delay 204 of pulse generator circuitry 104. Frequency of oscillator input pulses 112 may be controlled by varying the frequency of pulse sequences provided by pulse sequence control circuitry 102.

It will be understood that pulse generator circuitry logic 200 is exemplary only, and that any other combination of logic gates and/or other circuitry may be employed that is suitable for producing an oscillator input voltage pulse 112 having the characteristics described herein.

Figure 3:
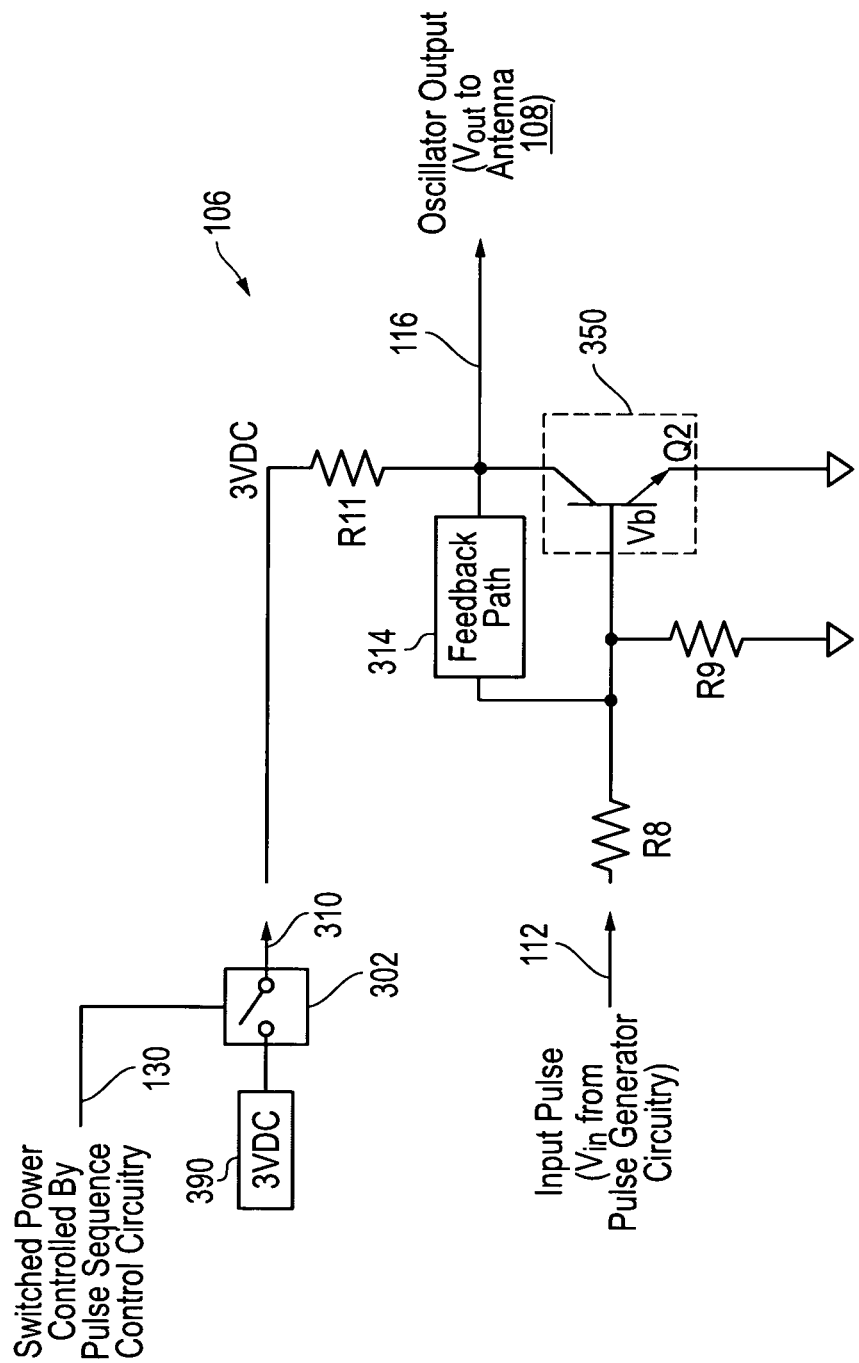
FIG. 3 is a circuit diagram of oscillator circuitry according to one exemplary embodiment of the disclosed systems and methods.

FIG. 3 illustrates one exemplary embodiment of oscillator circuitry 106 that may be coupled to input pulse creation circuitry 180. As shown, oscillator circuitry 106 includes a transistor switching element 350 in the form of high speed bipolar junction transistor (BJT) Q2 with feedback path 314 coupled as shown between base and collector of transistor Q2. Oscillator input voltage pulse 112 of pulse generator circuitry 106 is coupled as voltage in (Vin) to feedback path 314 and to the base of transistor Q2 via a pulse input resistor R8, and the base of transistor Q2 is coupled to ground through resistor R9 to provide a sink to balance the voltage of the base (Vb) of transistor Q2. In this configuration, input voltage pulse 112 drives the base of transistor Q2, and resistors R8 and R9 act to create a voltage divider from input voltage pulse 112 which drives transistor Q2 into saturation. Switched power 310 (e.g., 3 volts DC) is coupled via power input of oscillator circuitry 106 to the collector of transistor Q2 and to the voltage output (Vout to antenna) of oscillator circuitry 106 by a bias resistor R11 having a resistance value that may be selected to control power consumption and power output of the oscillator circuitry 106, and to implement output voltage (Vout) oscillation. In this regard, resistor R11 forms part of a bias network that regulates the power supply without disrupting the circuitry output. Switched power 310 is controlled in this embodiment by switch circuit 302 that receives power from a DC power supply 390 (e.g., such as from one or more battery cells) and a power control signal 130 from pulse sequence control circuitry 102 simultaneously with each oscillator input voltage pulse 112 of the same pulse sequence, i.e., such that power 310 is provided to oscillator circuitry 106 simultaneously with each oscillator input voltage pulse 112 from pulse generator circuitry 104.

Figure 4:
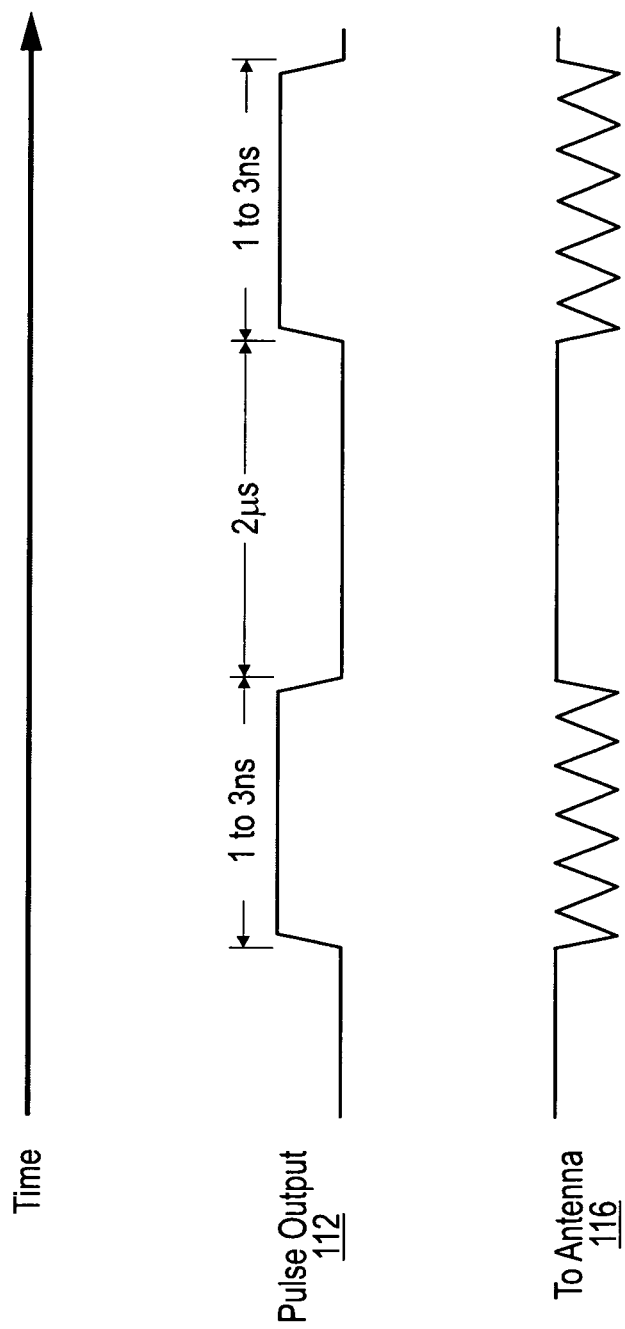
FIG. 4 illustrates oscillator input pulse and RF output signal versus time according to one exemplary embodiment of the disclosed systems and methods.

In the embodiment of FIG. 3, an oscillator input voltage pulse 112 of the desired length (supplied simultaneously with switched power 310) may be employed to start and stop voltage oscillations of RF output signal 116 that is provided to antenna 108 as follows. During each pulse sequence (e.g., as initiated and controlled by pulse sequence control circuitry 102 of input pulse creation circuitry 180) an oscillator input voltage pulse 112 received from pulse generator circuitry 104 of input pulse creation circuitry 180 turns on transistor Q2 and grounds the circuit, causing the output voltage (Vout) to drop, e.g., to a level of about 0.2 volts from a level of about 3 volts DC. This drop in voltage is fed back to the base of transistor Q2 via feedback path 314, turning transistor Q2 off, which in turn causes the output voltage (Vout) to go high again (e.g., about 3 volts DC). This increase in voltage is fed back to the base of transistor Q2 via feedback path 314, turning transistor Q2 on again, which in turn causes the output voltage (Vout) to go low again (e.g., about 0.2 volts DC). This sequence in which the transistor repetitively turns on and off serves to generate oscillating output voltage pulses for RF output signal 116 which are supplied to antenna 108 until oscillator input voltage pulse 112 is withdrawn as shown in FIG. 4, e.g., which in this embodiment illustrates oscillator input pulses each having a length of from about 1 to about 3 nanoseconds and being separated by about 2 microseconds, with less than about 1 nanosecond transition time from transistor off condition to transistor on condition, and vice-versa.

In the exemplary embodiment of FIG. 3, power may be saved by turning off switched power 310 during periods of time between oscillator input pulses 112, although the disclosed systems and methods may be alternatively practiced using oscillator circuitry 106 to generate voltage oscillations for RF output signal 116 without turning off power 310 between oscillator input pulses 112. Further, in the implementation of one embodiment of the disclosed systems and methods, transistor Q2 may be advantageously capable of turning on in less than a nanosecond, and turning off in less than a nanosecond, making high frequency oscillations possible.

However, it will be understood that transistor switching element 350 may be any transistor device (e.g., BJT transistor device, field effect transistor (FET) device such as metal oxide semiconductor FET (MOSFET) transistor device, etc.) suitable for generating oscillations of a variety of frequencies in response to a digital or analog input pulse fed to a control terminal (e.g., base of BJT, gate of FET) of the transistor device when an output terminal (e.g., emitter of BJT, drain of FET) of the transistor device is grounded and when an input terminal (e.g., collector of BJT, source of FET) of the transistor device is coupled to the base of the transistor device, including transistor devices that turn on in greater than a nanosecond and turn off in greater than a nanosecond as well as transistor devices that turn on in less than or equal to a nanosecond and turn off in less than or equal to a nanosecond.

The gated RF oscillator circuit employs feedback from the output of the circuit to the base of the transistor to allow a digital input pulse of a desired length to control the start and stop of oscillations from the circuit that generate RF oscillations for the pulsed output signal. A digital input pulse is fed to the base of the transistor to turn the transistor on and ground the circuit output and putting the transistor into saturation, which in turn causes a drop in the output voltage from the output of the circuit (e.g., from about 3 volts DC to about 0.2 volts DC). While the digital input pulse is still present at the base of the transistor, the drop in output voltage is fed back to the base of the transistor to turn the transistor off, causing the output voltage of the gated RF circuit to again go high. When the voltage at the base of the transistor goes high, it turns on the transistor and grounds the output of the circuit once more, resulting in another drop in voltage at the base of the transistor, thus turning the transistor off again. This sequence of turning the transistor on and off results in RF oscillations in the output signal pulse. The oscillations continue during the duration of time that the digital input signal pulse is fed to the base of the transistor.

As previously indicated, oscillator input voltage pulse 112 may have a duration of, for example, from about 1 to about 3 nanoseconds, with the resulting RF output signal having a frequency of from about 3 to about 30 GHz, although frequencies less than 3 GHz and greater than 30 GHz are also possible. In one exemplary embodiment, each oscillator input voltage pulse 112 of FIG. 4 may have a duration of about 2.75 nanoseconds with individual oscillator input pulses 112 being separated from each other by about 2 microseconds (during which time power 130 is off), and each resulting RF output signal 116 generated therefrom may have a frequency of about 6.75 GHz. Power output in one exemplary embodiment may be from about 0 to about −10 dBm to antenna 108.

Figure 5:
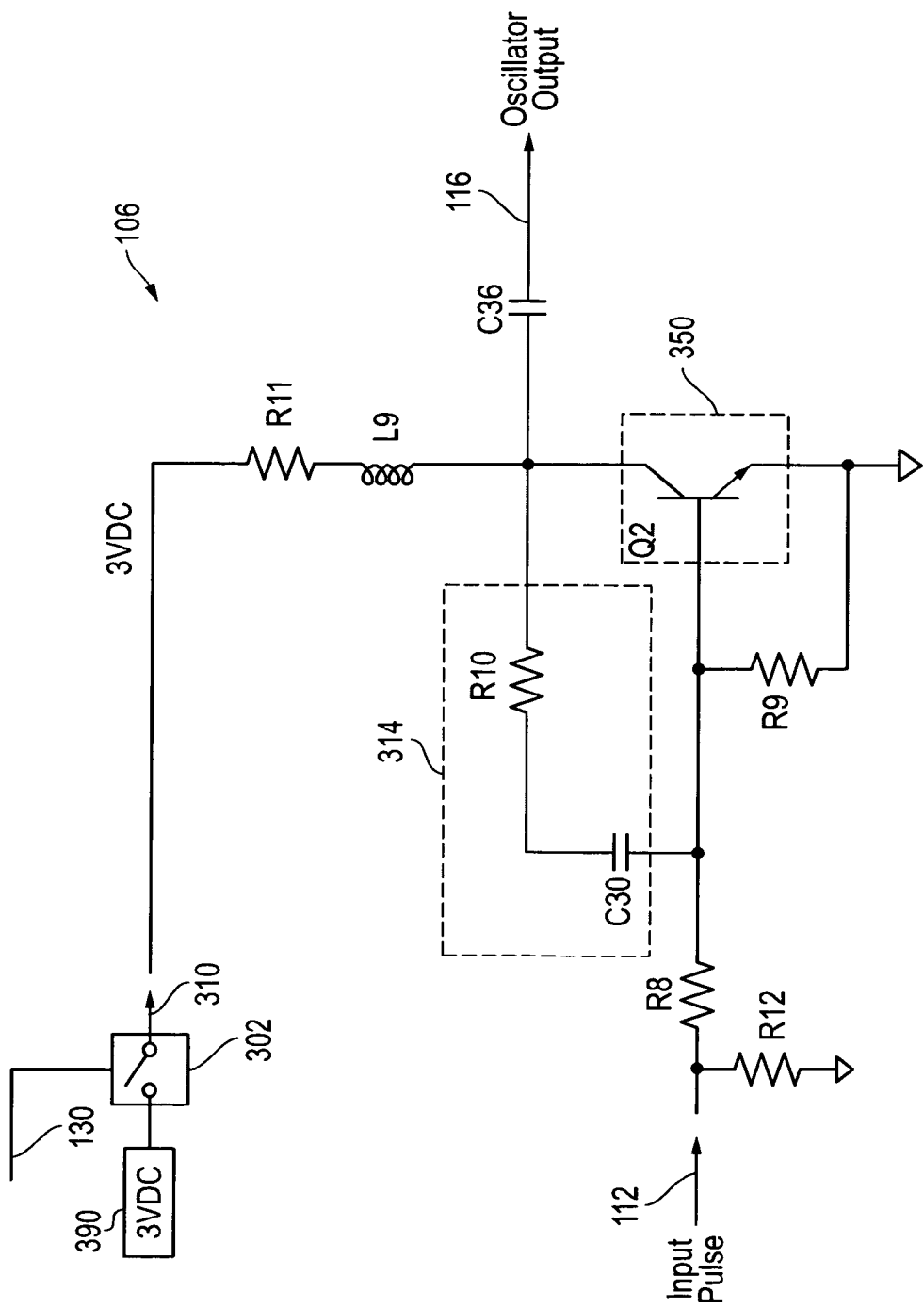
FIG. 5 is a circuit diagram of oscillator circuitry according to one exemplary embodiment of the disclosed systems and methods.

FIG. 5 illustrates one specific exemplary embodiment of oscillator circuitry 106 having a signal input that may be coupled to input pulse creation circuitry 180 in a manner as previously described. Components of oscillator circuitry 106 may be provided and coupled together on a printed circuit board material that is selected for its suitability for facilitating desired circuit oscillation characteristics, e.g., such as FR-4 printed circuit board material, RO4000 series high frequency circuit materials from Rogers Corporation of Chandler, Ariz. (RO4003C or RO4350B material), or any other RF board material. As shown in FIG. 5, an optional RF choke inductor L9 (e.g., 560 nHenry) may be provided in series with resistor R11 and power 310 for blocking transmittal of oscillations from transistor Q2 (e.g., Infineon BFP640 NPN SiGe RF transistor, or NXP BFU725 NPN microwave transistor) back to power supply 390. As further shown, feedback path 314 of oscillator circuitry 106 may include a resistor R10 and blocking capacitor C30 which may be present to isolate switched power 310 from ground through resistor R9 (e.g., a 10 kohm resistor). It will be understood that the positioning of resistor R10 relative to blocking capacitor C30 in feedback path 314 may be reversed. It will be understood that particular combinations of resistor feedback path resistor R10, feedback blocking capacitor C30, and pulse input resistor R8 may be selected to together achieve the desired oscillation characteristics to fit a given application. For example, in the exemplary embodiment of FIG. 5, feedback path resistor R10 may be a 10 ohm resistor, feedback path blocking capacitor C30 may be a 100 picofarad capacitor, and pulse input resistor R8 may be a 130 ohm resistor. An optional DC blocking capacitor C36 (e.g., 1 picofarad) may be provided as shown to isolate the oscillator circuitry output from switched power 310 while allowing the waveform to pass through. An optional resistor R12 may be provided as shown to remove RF signal generation when power signal 310 is applied or withdrawn.

The identity and values of the various circuit components of oscillator circuitry 106 listed in the preceding paragraphs are exemplary only, and it will be understood that benefits of the disclosed RF signal generation systems and oscillator circuitry may be practiced with different combinations of circuit components and/or values thereof.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Oscillator circuitry, comprising:
a transistor switching element having a control terminal, a first node and a second node, the first node of the transistor switching element being coupled to a power source and an output of the oscillator circuitry, the control terminal of the transistor switching element being coupled to an input voltage pulse source, and the second node of the transistor being coupled to ground; and
a feedback path coupled between the first node and control terminal of the transistor switching element;
wherein the transistor switching element is configured to remain in the off condition to isolate the first node from the second node and ground during the absence of an input voltage pulse applied to the control terminal of the transistor switching element and wherein the transistor switching element is configured to be in the on position to couple the first node to the second node and ground during the presence of an input voltage pulse applied to the control terminal of the transistor switching element;
wherein the transistor switching element is configured to repetitively cycle between on and off multiple times in response to an input voltage pulse applied to the control terminal of the transistor switching element while voltage is supplied from the power source to the first node of the transistor element to generate voltage oscillations at the output of the oscillator circuitry for a duration of time that the input voltage pulse is applied to the control terminal of the transistor device, the transistor device being configured to couple the power source to ground each time the transistor cycles to the on condition, and the transistor device being configured to isolate the power source from ground each time the transistor cycles to the off condition;
where a sequence in which the transistor switching element repetitively cycles between on and off multiple times acts to generate the respective voltage oscillations at the output of the oscillator circuitry; and
wherein the transistor switching element is a bipolar junction transistor device and the control terminal is a base of the transistor, or wherein the transistor switching element is a field effect transistor (FET) transistor and the control terminal is a gate of the transistor;
wherein the feedback path is coupled to the control terminal of the transistor switching element at a third node of the circuitry; and wherein the oscillator circuitry further comprises a first resistor coupled between the power source and the third node of the circuitry, and a second resistor coupled between the power source and the first node of the transistor switching element.

2. The oscillator circuitry of claim 1, further comprising a DC blocking capacitor coupled between the power source and the output of the oscillator circuitry.

3. The oscillator circuitry of claim 1, wherein the control terminal of the transistor switching element is coupled to ground.

4. The oscillator circuitry of claim 1, wherein the feedback path comprises a series feedback circuit coupled between the first node and control terminal of the transistor switching element.

5. Oscillator circuitry, comprising:
a transistor switching element having a control terminal, a first node and a second node, the first node of the transistor switching element being coupled to a power source and an output of the oscillator circuitry, the control terminal of the transistor switching element being coupled to an input voltage pulse source, and the second node of the transistor being coupled to ground; and
a feedback path coupled between the first node and control terminal of the transistor switching element;
wherein the transistor switching element is configured to remain in the off condition to isolate the first node from the second node and ground during the absence of an input voltage pulse applied to the control terminal of the transistor switching element and wherein the transistor switching element is configured to be in the on position to couple the first node to the second node and ground during the presence of an input voltage pulse applied to the control terminal of the transistor switching element;
wherein the transistor switching element is configured to repetitively cycle between on and off multiple times in response to an input voltage pulse applied to the control terminal of the transistor switching element while voltage is supplied from the power source to the first node of the transistor element to generate voltage oscillations at the output of the oscillator circuitry for a duration of time that the input voltage pulse is applied to the control terminal of the transistor device, the transistor device being configured to couple the power source to ground each time the transistor cycles to the on condition, and the transistor device being configured to isolate the power source from ground each time the transistor cycles to the off condition;
where a sequence in which the transistor switching element repetitively cycles between on and off multiple times acts to generate the respective voltage oscillations at the output of the oscillator circuitry; and
wherein the transistor switching element is a bipolar junction transistor device and the control terminal is a base of the transistor, or wherein the transistor switching element is a field effect transistor (FET) transistor and the control terminal is a gate of the transistor;
wherein the feedback path is coupled to the control terminal of the transistor switching element at a third node of the circuitry; wherein the control terminal of the switching element is coupled to ground; wherein the oscillator circuitry further comprises:
a first resistor coupled between the input voltage pulse source and the third node,
a second resistor coupled between the power source and the first node of the transistor switching element,
a third resistor coupled between the control terminal of the transistor switching element and ground, and
a first blocking capacitor coupled between the power source and the output of the oscillator circuitry;
wherein the feedback path comprises a fourth resistor and a second blocking capacitor coupled in series between the third node and the output of the oscillator circuitry.

6. The oscillator circuitry of claim 5, wherein the transistor switching element is a bipolar junction transistor device; wherein the control terminal is a base; wherein the first node is a collector; wherein the second node an emitter; wherein the transistor switching element is configured to turn on in less than a nanosecond to couple the power source to ground and then turn off in less than a nanosecond to isolate the power source from ground; and wherein the frequency of the voltage oscillations generated at the output of the oscillator circuitry is from about 3 GHz to about 30 GHz.

7. The oscillator circuitry of claim 5, where the transistor switching element is either one of:

a bipolar junction transistor in which the control terminal is a base of the transistor, the first node is a collector of the transistor, and the second node is an emitter of the transistor; or a field effect transistor (FET) transistor in which the control terminal is a gate of the transistor, the first node is a source of the transistor, and the second node is a drain of the transistor.

8. The oscillator circuitry of claim 5, where the transistor switching element is a three-terminal transistor having three terminals that are terminals of the same common transistor, the three terminals being the control terminal of the transistor, a second terminal that is the first node of the transistor, and a third terminal that is the second node of the transistor; where the control terminal is configured to turn on the transistor by selectably electrically connecting the first node to the second node across the transistor upon application of a higher voltage to the control terminal; and where the control terminal is configured to selectably turn off the transistor by electrically disconnecting the first node from the second node across the transistor upon application of a lower voltage or no voltage to the control terminal.

9. A RF signal generation system, comprising:

input pulse creation circuitry configured to produce an input voltage pulse; and oscillator circuitry having a signal input coupled to receive the input voltage pulse from the input pulse creation circuitry, having a signal output to produce an RF output signal, and having a power input coupled to receive power from a power source;

wherein the oscillator circuitry comprises:
   a transistor switching element having a control terminal, a first node and a second node, the first node of the transistor switching element being coupled to the power input of the oscillator circuitry and the signal output of the oscillator circuitry, the control terminal of the transistor switching element being coupled to the signal output of the oscillator circuitry, and the second node of the transistor being coupled to ground, and
   a feedback path coupled between the first node and control terminal of the transistor switching element,
   wherein the transistor switching element is configured to remain in the off condition to isolate the first node from the second node and ground during the absence of an input voltage pulse applied to the control terminal of the transistor switching element and wherein the transistor switching element is configured to be in the on position to couple the first node to the second node and ground during the presence of an input voltage pulse applied to the control terminal of the transistor switching element,
   wherein the transistor switching element is configured to repetitively cycle between on and off multiple times in response to an input voltage pulse applied to the control terminal of the transistor switching element while voltage is supplied from the power source to the first node of the transistor element to generate voltage oscillations at the output of the oscillator circuitry for the duration of time that the input voltage pulse is applied to the control terminal of the transistor device, the transistor device being configured to couple the power source to ground each time the transistor cycles to the on condition, and the transistor device being configured to isolate the power source from ground each time the transistor cycles to the off condition,
   where a sequence in which the transistor switching element repetitively cycles between on and off multiple times acts to generate the respective voltage oscillations at the output of the oscillator circuitry,
   wherein the transistor switching element is a bipolar junction transistor device and the control terminal is a base of the transistor, or wherein the transistor switching element is a field effect transistor (FET) transistor and the control terminal is a gate of the transistor;
   wherein the input pulse creation circuitry is configured to produce and supply an intermittent input voltage pulse to the signal input of the oscillator circuitry; and
   wherein the oscillator circuitry is coupled to a power source that is configured to only supply power to the power input of the oscillator circuitry at the same time an intermittent input voltage pulse is supplied to the signal input of the oscillator circuitry, and to not supply power to the power input of the oscillator circuitry when an intermittent input voltage pulse is not being supplied to the signal input of the oscillator circuitry.

10. The system of claim 9, wherein the input pulse creation circuitry comprises pulse sequence control circuitry and pulse generator circuitry, the pulse sequence control circuitry being configured to simultaneously control the supply of power and a pulse sequence signal to the pulse generator circuitry such that power is only supplied to the pulse generator circuitry when a pulse sequence signal is provided to the pulse generator circuitry, and the pulse generator circuitry being configured to produce and supply the intermittent input voltage pulse to the signal input of the oscillator circuitry for the duration of the pulse sequence signal provided by the pulse sequence control circuitry; and wherein the pulse sequence control circuitry is further configured to control the supply of power from the power source to the power input of the oscillator circuitry such that power is supplied to the power input of the oscillator circuitry at the same time an intermittent input voltage pulse is supplied to the signal input of the oscillator circuitry, and such that power is not supplied to the power input of the oscillator circuitry when an intermittent input voltage pulse is not being supplied to the signal input of the oscillator circuitry.

11. The system of claim 9, further comprising an antenna coupled to receive the RF output signal from the oscillator circuitry.

12. The system of claim 9, wherein the RF output signal is a RF signal in the range of from 3.1 GHz to 10.6 GHz at a limited transmit power of −41.3 dBm/MHz with an emitted signal bandwidth that exceeds the lesser of 500 MHz or 20% of the center frequency.

13. The RF signal generation system of claim 9 where the transistor switching element is a three-terminal transistor having three terminals that are terminals of the same common transistor, the three terminals being the control terminal of the transistor, a second terminal that is the first node of the transistor, and a third terminal that is the second node of the transistor; where the control terminal is configured to turn on the transistor by selectably electrically connecting the first node to the second node across the transistor upon application of a higher voltage to the control terminal; and where the control terminal is configured to selectably turn off the transistor by electrically disconnecting the first node from the second node across the transistor upon application of a lower voltage or no voltage to the control terminal.

14. The system of claim 9, wherein the feedback path comprises a series feedback circuit coupled between the first node and control terminal of the transistor switching element.

15. A method for generating an oscillating signal, comprising:
- providing oscillator circuitry comprising:
  - a transistor switching element having a control terminal, a first node and a second node, the first node of the transistor switching element being coupled to a power source and an output of the oscillator circuitry, the control terminal of the transistor switching element being coupled to an input voltage pulse source, and the second node of the transistor being coupled to ground, and
  - a feedback path coupled between the first node and control terminal of the transistor switching element;
- maintaining the transistor switching element in an off condition to isolate the first node from the second node and ground during the absence of an input voltage pulse applied to the control terminal of the transistor switching element and placing the transistor switching element in the on position to couple the first node to the second node and ground during the presence of an input voltage pulse applied to the control terminal of the transistor switching element; and
- simultaneously supplying voltage to the first node of the transistor element and applying an input voltage pulse to the control terminal of the transistor switching element to cause the transistor switching element to repetitively cycle between on and off multiple times while voltage is supplied to the first node of the transistor element so as to generate voltage oscillations at the output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition;
- where a sequence in which the transistor switching element repetitively cycles between on and off multiple times acts to generate the respective voltage oscillations at the output of the oscillator circuitry;
- wherein the transistor switching element is a bipolar junction transistor device and the control terminal is a base of the transistor, or wherein the transistor switching element is a field effect transistor (FET) transistor and the control terminal is a gate of the transistor;
- wherein the feedback path is coupled to the control terminal of the transistor switching element at a third node of the circuitry; and
- wherein the method further comprises providing a first resistor coupled between the power source and the third node and a second resistor coupled between the power source and the first node of the transistor switching element, and supplying the voltage to the first node of the transistor element from the power source.

16. A method for generating an oscillating signal, comprising:
- providing oscillator circuitry comprising:
  - a transistor switching element having a control terminal, a first node and a second node, the first node of the transistor switching element being coupled to a power source and an output of the oscillator circuitry, the control terminal of the transistor switching element being coupled to an input voltage pulse source, and the second node of the transistor being coupled to ground, and
  - a feedback path coupled between the first node and control terminal of the transistor switching element;
- maintaining the transistor switching element in an off condition to isolate the first node from the second node and ground during the absence of an input voltage pulse applied to the control terminal of the transistor switching element and placing the transistor switching element in the on position to couple the first node to the second node and ground during the presence of an input voltage pulse applied to the control terminal of the transistor switching element; and
- simultaneously supplying voltage to the first node of the transistor element and applying an input voltage pulse to the control terminal of the transistor switching element to cause the transistor switching element to repetitively cycle between on and off multiple times while voltage is supplied to the first node of the transistor element so as to generate voltage oscillations at the output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition;
- where a sequence in which the transistor switching element repetitively cycles between on and off multiple times acts to generate the respective voltage oscillations at the output of the oscillator circuitry;
- wherein the transistor switching element is a bipolar junction transistor device and the control terminal is a base of the transistor, or wherein the transistor switching element is a field effect transistor (FET) transistor and the control terminal is a gate of the transistor;
- wherein the feedback path is coupled to the control terminal of the transistor switching element at a third node of the circuitry; wherein the control terminal of the switching element is coupled to ground; and
- wherein the method further comprises:
  - providing a first resistor coupled between the input voltage pulse source and the third node,
  - providing a second resistor coupled between the power source and the first node of the transistor switching element,
  - providing a third resistor coupled between the control terminal of the transistor switching element and ground, and
  - providing a first blocking capacitor coupled between the power source and the output of the oscillator circuitry,
  - providing the feedback path with a fourth resistor and a second blocking capacitor coupled between the third node and the output of the oscillator circuitry.

17. A method for generating an oscillating signal, comprising:
- providing oscillator circuitry comprising:
  - a transistor switching element having a control terminal, a first node and a second node, the first node of the transistor switching element being coupled to a power source and an output of the oscillator circuitry, the control terminal of the transistor switching element being coupled to an input voltage pulse source, and the second node of the transistor being coupled to ground, and
  - a feedback path coupled between the first node and control terminal of the transistor switching element;
- maintaining the transistor switching element in an off condition to isolate the first node from the second node and ground during the absence of an input voltage pulse applied to the control terminal of the transistor switching element and placing the transistor switching element in the on position to couple the first node to the second node and ground during the presence of an input voltage pulse applied to the control terminal of the transistor switching element; and simultaneously supplying voltage to the first node of the transistor element and applying an input voltage pulse to the control terminal of the transistor switching element to cause the transistor switching element to repetitively cycle between on and off multiple times while voltage is supplied to the first node of the transistor element so as to generate voltage oscillations at the output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition;

where a sequence in which the transistor switching element repetitively cycles between on and off multiple times acts to generate the respective voltage oscillations at the output of the oscillator circuitry;

wherein the transistor switching element is a bipolar junction transistor device and the control terminal is a base of the transistor, or wherein the transistor switching element is a field effect transistor (FET) transistor and the control terminal is a gate of the transistor; and where the method further comprises:
providing input pulse creation circuitry coupled to a signal input of the oscillator circuitry, the control terminal of the transistor switching element being coupled to the signal input, providing a power source coupled to a power input of the oscillator circuitry, the first node of the transistor switching element being coupled to the power input, supplying an intermittent input voltage pulse from the pulse creation circuitry to the signal input of the oscillator circuitry, supplying power from the power source to a power input of the oscillator circuitry at the same time an intermittent input voltage pulse is supplied to the signal input of the oscillator circuitry, and not supplying power to the power input of the oscillator circuitry when an intermittent input voltage pulse is not being supplied to the signal input of the oscillator circuitry, producing a RF output signal at a signal output of the oscillator circuitry, the signal output being coupled to the first node of the transistor switching element, and the RF output signal being produced in response to the intermittent input voltage pulse applied through the signal input to the control terminal of the transistor switching element while voltage is supplied through the power input to the first node of the transistor element to generate voltage oscillations of the RF output signal at the signal output of the oscillator circuitry for the duration of time that the input voltage pulse is applied to the control terminal of the transistor device, the transistor device coupling the power source to ground each time the transistor cycles to the on condition, and the transistor device isolating the power source from ground each time the transistor cycles to the off condition.

18. The method of claim 17, wherein the transistor switching element is a bipolar junction transistor device; wherein the control terminal is a base; wherein the first node is a collector; wherein the second node is an emitter; wherein the transistor switching element turns on in less than a nanosecond to couple the power source to ground and then turns off in less than a nanosecond to isolate the power source from ground; and wherein the frequency of the voltage oscillations generated at the output of the oscillator circuitry is from about 3 GHz to about 30 GHz.

19. The method of claim 17, wherein the transistor switching element is a bipolar junction transistor device; wherein the control terminal is a base; wherein the first node is a collector; wherein the second node is an emitter; wherein the RF output signal is a RF signal in the range of from 3.1 GHz to 10.6 GHz at a limited transmit power of −41.3 dBm/MHz with an emitted signal bandwidth that exceeds the lesser of 500 MHz or 20% of the center frequency.

20. The method of claim 17, further comprising providing a DC blocking capacitor coupled between the power source and the output of the oscillator circuitry.

21. The method of claim 17, wherein the control terminal of the transistor switching element is coupled to ground.

22. The method of claim 17, wherein the input pulse creation circuitry comprises pulse sequence control circuitry and pulse generator circuitry; and wherein the method further comprises:
using the pulse sequence control circuitry to simultaneously control the supply of power and a pulse sequence signal to the pulse generator circuitry such that power is only supplied to the pulse generator circuitry when a pulse sequence signal is provided to the pulse generator circuitry, using the pulse generator circuitry to produce and supply the intermittent input voltage pulse to the signal input of the oscillator circuitry for the duration of the pulse sequence signal provided by the pulse sequence control circuitry, and using the pulse sequence control circuitry to control the supply of power from the power source to the power input of the oscillator circuitry such that power is supplied to the power input of the oscillator circuitry at the same time an intermittent input voltage pulse is supplied to the signal input of the oscillator circuitry, and such that power is not supplied to the power input of the oscillator circuitry when an intermittent input voltage pulse is not being supplied to the signal input of the oscillator circuitry.

23. The method of claim 17, further comprising providing an antenna coupled to the signal output of the oscillator circuitry; and providing the RF output signal from the signal output of the oscillator circuitry to the antenna.

24. The method of claim 17, where the transistor switching element is either one of:
a bipolar junction transistor in which the control terminal is a base of the transistor, the first node is a collector of the transistor, and the second node is an emitter of the transistor; or a field effect transistor (FET) transistor in which the control terminal is a gate of the transistor, the first node is a source of the transistor, and the second node is a drain of the transistor.

25. The method of claim 17,
where the transistor switching element is a three-terminal transistor having three terminals that are terminals of the same common transistor, the three terminals being a first terminal that is the control terminal of the transistor, a second terminal that is the first node of the transistor, and a third terminal that is the second node of the transistor; where the control terminal is configured to turn on the transistor by selectably electrically connecting the first node to the second node across the transistor upon application of a higher voltage to the control terminal; and where the control terminal is configured to selectably turn off the transistor by electrically disconnecting the first node from the second node across the transistor upon application of a lower voltage or no voltage to the control terminal.

26. The method of claim 17, wherein the feedback path comprises a series feedback circuit coupled between the first node and control terminal of the transistor switching element.

27. The oscillator circuitry of claim 9, wherein the transistor switching element is a bipolar junction transistor device; wherein the control terminal is a base, wherein the first node is a collector; and wherein the second node is an emitter.

* * * * *